(12) United States Patent
Kadokura et al.

(10) Patent No.: US 7,135,097 B2
(45) Date of Patent: *Nov. 14, 2006

(54) BOX-SHAPED FACING-TARGETS SPUTTERING APPARATUS AND METHOD FOR PRODUCING COMPOUND THIN FILM

(75) Inventors: Sadao Kadokura, Hachioji (JP); Hisanao Anpuku, Kokubunji (JP)

(73) Assignee: FTS Corporation, Tokyo (JP)

( * ) Notice: Subject to any disclaimer, the term of this patent is extended or adjusted under 35 U.S.C. 154(b) by 142 days.

This patent is subject to a terminal disclaimer.

(21) Appl. No.: 10/721,081

(22) Filed: Nov. 26, 2003

(65) Prior Publication Data

US 2005/0023129 A1    Feb. 3, 2005

(30) Foreign Application Priority Data

Jul. 28, 2003  (JP) ............................. 2003-280634

(51) Int. Cl.
  *C23C 14/35*  (2006.01)
(52) U.S. Cl. ........................... 204/192.29; 204/192.12; 204/192.23; 204/192.26; 204/298.12; 204/298.14; 204/298.17; 204/298.18; 204/298.19
(58) Field of Classification Search ........... 204/192.12, 204/192.23, 192.26, 192.29, 298.12, 298.17, 204/298.18, 298.19
See application file for complete search history.

(56) References Cited

U.S. PATENT DOCUMENTS

| | | | | |
|---|---|---|---|---|
| 4,784,739 A | * | 11/1988 | Kadokura et al. | ........ 204/192.2 |
| 5,240,581 A | * | 8/1993 | Kim | ....................... 204/192.26 |
| 6,156,172 A | | 12/2000 | Kadokura et al. | ..... 204/298.26 |
| 6,685,805 B1 | * | 2/2004 | Kiyota et al. | .......... 204/192.29 |

(Continued)

FOREIGN PATENT DOCUMENTS

EP    1261042 A1    11/2002

(Continued)

OTHER PUBLICATIONS

Machine translation of 2003-155564.*

*Primary Examiner*—Rodney G. McDonald
(74) *Attorney, Agent, or Firm*—Westerman, Hattori, Daniels & Adrian, LLP.

(57) ABSTRACT

Disclosed is a box-shaped facing-targets sputtering apparatus capable of forming, at low temperature, a compound thin film of high quality while causing minimal damage to an underlying layer. The box-shaped facing-targets sputtering apparatus includes a box-shaped facing-targets sputtering unit and a vacuum chamber, the sputtering unit including a rectangular parallelepiped frame having six faces, one of which serves as an opening face, and a pair of facing target units, each including a target and magnetic-field generation means formed of a permanent magnet which is provided so as to surround the target, which means generates a facing-mode magnetic field extending in a direction perpendicular to the surface of the target and a magnetron-mode magnetic field extending in a direction parallel to the target surface, in which the target units are provided on first opposing faces of the frame which are located adjacent to the opening face, and second opposing faces and the remaining one face of the frame are shutted, wherein the sputtering unit is provided on the vacuum chamber such that the opening face faces the vacuum chamber and a substrate on which a thin film is to be formed, the substrate being disposed in the vacuum chamber, which sputtering apparatus further includes, in a plasma confinement space, an auxiliary electrode which absorbs electrons, the plasma confinement space being provided in the interior of the sputtering unit.

22 Claims, 4 Drawing Sheets

U.S. PATENT DOCUMENTS

| | | | |
|---|---|---|---|
| 6,881,311 B1 * | 4/2005 | Kadokura et al. ..... | 204/298.18 |
| 2002/0066669 A1 | 6/2002 | Kadokura | |
| 2002/0173068 A1 | 11/2002 | Kido et al. | |
| 2003/0094365 A1 | 5/2003 | Kadokura et al. | |
| 2004/0149574 A1 * | 8/2004 | Madocks ............... | 204/298.16 |

FOREIGN PATENT DOCUMENTS

| | | | |
|---|---|---|---|
| JP | 10-8246 | | 1/1998 |
| JP | 10-330936 | | 12/1998 |
| JP | 2003-155564 | * | 5/2003 |

* cited by examiner

BOX-SHAPED FACING-TARGETS SPUTTERING APPARATUS AND METHOD FOR PRODUCING COMPOUND THIN FILM

BACKGROUND OF THE INVENTION

1. Field of the Invention

The present invention relates to an improvement in a box-shaped facing-targets sputtering apparatus including a box-shaped facing-targets sputtering unit and a vacuum chamber, the sputtering unit including a rectangular parallelepiped frame having six faces, one of which serves as an opening face, and a pair of facing target units, each including a target and magnetic-field generation means formed of a permanent magnet which is provided so as to surround the target, which means generates a facing-mode magnetic field extending in a direction perpendicular to the surface of the target and a magnetron-mode magnetic field extending in a direction parallel to the target surface, in which the target units are provided on first opposing faces of the frame which are located adjacent to the opening face, and second opposing faces and the remaining one face of the frame are shutted, wherein the sputtering unit is provided on the vacuum chamber such that the opening face faces the vacuum chamber and a substrate on which a thin film is to be formed, the substrate being disposed in the vacuum chamber. The present invention also relates to a method for producing a compound thin film by use of the thus-improved sputtering apparatus.

2. Description of the Related Art

The aforementioned box-shaped facing-targets sputtering apparatus including the box-shaped facing-targets sputtering unit, which has been disclosed by the present inventor in Japanese Patent Application Laid-Open (kokai) No. 10-330936, is configured as described below.

As shown in FIG. 7, a box-shaped facing-targets sputtering unit 70 is configured such that facing target units 100a and 100b are mounted on opposing faces 71a and 71b of four faces 71a through 71d (among five faces 71a through 71e) which are provided adjacent to an opening face 71f, which serves as an opening of a rectangular parallelepiped frame 71, and such that the three faces 71c through 71e are covered by closure plates 72c through 72e, respectively. The target unit 100a includes a target 110a and magnetic-field generation means formed of a permanent magnet which is provided so as to surround the target 110a, and the target unit 100b includes a target 110b (not illustrated) and magnetic-field generation means formed of a permanent magnet which is provided so as to surround the target 110b. The entirety of the sputtering unit 70 assumes a rectangular parallelepiped box shape, which may be cubic. The box-shaped facing-targets sputtering apparatus has a configuration as described below. Specifically, as shown in FIG. 1, the box-shaped facing-targets sputtering unit is connected to a vacuum chamber such that the opening face 71f of the sputtering unit faces the vacuum chamber, and a substrate on which a thin film is to be formed is placed within the vacuum chamber so as to face the opening face 71f.

In the sputtering apparatus having the above-described configuration, a magnetic field for generating and confining sputtering plasma is formed as in the case of a conventional facing-targets sputtering apparatus disclosed in, for example, Japanese Patent Application Laid-Open (kokai) No. 10-8246. Specifically, within a space provided between the facing targets of the facing target units including magnetic-field generation means (the space is hereinafter called a "(plasma) confinement space"), a facing-mode magnetic field extending in the direction perpendicular to the targets is formed throughout the targets, and, in addition, a magnetron-mode magnetic field extending in the direction parallel to the surfaces of the targets is formed in the vicinity of the target surfaces so as to surround the peripheral edges of the targets. As a result, high-density plasma is generated over the entire surfaces of the targets.

Therefore, in the box-shaped facing-targets sputtering apparatus including the box-shaped facing-targets sputtering unit, in which the five faces other than the opening face are shielded, sputtered particles fly, via the opening face, to the highly evacuated vacuum chamber in which the substrate is placed, and are deposited onto the substrate, to thereby form a thin film.

The aforementioned conventional box-shaped facing-targets sputtering apparatus has a compact configuration, and enables formation of a thin film of high quality at low temperature. Therefore, the sputtering apparatus has been applied to formation of various films. For example, the sputtering apparatus has been applied to formation of electrodes of organic EL devices, which have recently become of interest and have been increasingly developed for commercialization, and various studies have been performed on application of the sputtering apparatus to formation of the electrodes.

Such an electrode must be formed on an organic layer. Therefore, the electrode must be formed so as not to cause any damage to the organic layer serving as an underlying layer. In addition, the electrode must be in the form of a thin film of high quality (e.g., a thin film of low resistance), and, in some cases, the electrode must be in the form of a thin film exhibiting excellent transparency. Meanwhile, in the case where a protective layer is formed on an organic layer, the protective layer must be formed so as not to cause any damage to the organic layer serving as an underlying layer, and the protective layer must be in the form of a thin film exhibiting excellent protective properties (e.g., damp-proof property) and transparency.

Similar to the above case, in the case of production of a high-performance film such as a transparent heat-insulating film, when a compound thin film (e.g., a metal oxide thin film or a metal nitride thin film) is formed on an underlying layer, a thin film of high quality exhibiting intended characteristics must be formed so as not to cause any damage to the underlying layer.

Therefore, instead of being formed by means of conventional vacuum deposition, such a thin film must be formed by means of sputtering, which can form a film of high density exhibiting excellent uniformity.

SUMMARY OF THE INVENTION

In view of the foregoing, a first object of the present invention is to provide a box-shaped facing-targets sputtering apparatus capable of forming, at low temperature, a thin film of high quality which meets the aforementioned requirements while causing minimal damage to an underlying layer. A second object of the present invention is to provide a method for producing a compound thin film, which method can produce, at low temperature, a high-quality compound thin film (e.g., a metal oxide thin film or a metal nitride thin film) which is employed as, for example, a transparent electrically conductive film or a passivation film.

The aforementioned objects can be achieved by the present invention described hereinbelow. According to a first aspect of the present invention, there is provided a box-shaped facing-targets sputtering apparatus comprising a box-shaped facing-targets sputtering unit and a vacuum chamber, the sputtering unit including a rectangular parallelepiped frame having six faces, one of which serves as an opening face, and a pair of facing target units, each including a target and magnetic-field generation means formed of a permanent magnet which is provided so as to surround the target, which means generates a facing-mode magnetic field extending in a direction perpendicular to the surface of the target and a magnetron-mode magnetic field extending in a direction parallel to the target surface, in which the target units are provided on first opposing faces of the frame which are located adjacent to the opening face, and second opposing faces and the remaining one face of the frame are shutted, wherein the sputtering unit is provided on the vacuum chamber such that the opening face faces the vacuum chamber and a substrate on which a thin film is to be formed, the substrate being disposed in the vacuum chamber, which sputtering apparatus further comprises, in a plasma confinement space, an auxiliary electrode which absorbs electrons, the plasma confinement space being provided in the interior of the sputtering unit.

According to a second aspect of the present invention, there is provided a method for producing a compound thin film by use of the box-shaped facing-targets sputtering apparatus including the auxiliary electrode.

The present invention has been accomplished as described below.

During the course of film formation by use of the conventional box-shaped facing-targets sputtering apparatus, in the box-shaped facing-targets sputtering unit, there is observed plasma emission constituted by an hourglass-shaped emission component attributed to a facing-mode magnetic field, which emission component extends from the surfaces of the facing targets toward the midpoint between the targets such that emission beams are gradually thinned, and a bowl-shaped emission component of semicircular cross section attributed to a magnetron-mode magnetic field, which emission component occurs in the vicinity of the target surfaces, and in addition, there is observed subtle emission which extends from the remaining space toward the outside of the opening of the sputtering unit. Various studies have been performed on the subtle emission, and as a result, the subtle emission has been considered to represent mainly an excitation state Of the gas particles generated through the following procedure: electrons of high energy emitted from the target surfaces collide with sputtered gas particles while the electrons drift back and forth between the targets within the plasma confinement space of the box-shaped sputtering unit; the energy of the electrons is consumed through, for example, ionization, whereby the electrons are transformed into thermalized electrons of low energy; and, when the resultant thermalized electrons are released from confinement by magnetic fluxes and are diffused into the vacuum chamber, the thermalized electrons collide with dispersed gas particles and excite them. The thermalized electrons of low energy are gradually released from confinement by the magnetic fluxes within the plasma confinement space during the process in which the energy of the thermalized electrons is lost. In the case of a conventional side-opened-type facing-targets sputtering apparatus, the thermalized electrons are dispersed into a space surrounding the apparatus, and thus the plasma confinement space is not filled with the thermalized electrons. In contrast, in the box-shaped facing-targets sputtering unit, in which the faces of the unit are shielded, conceivably, a portion of the thermalized electrons flow to the closure plates covering the faces serving as an anode, the remaining portion of the thermalized electrons remains within the plasma confinement space of the box-shaped unit; i.e., the plasma confinement space is filled with the thermalized electrons, and the thermalized electrons drift through the opening face of the sputtering unit, to thereby generate subtle emission which extends toward the outside of the opening. In addition, conceivably, when the thermalized electrons of low energy reach the surface of the substrate, in some cases, the thermalized electrons flow via the substrate or a film formed on the substrate, to thereby generate Joule heat; i.e., the thermalized electrons become a critical factor for heating of the substrate, or lower the quality of the film formed on the substrate. In view of the foregoing, the present inventor has considered that the performance of the sputtering apparatus is effectively improved by removing the thermalized electrons which pass through the opening face of the sputtering unit to the substrate, and have developed an auxiliary electrode which directly absorbs the thermalized electrons within the plasma confinement space.

The present inventor has performed various studies, and as a result have found that, as compared with the case of the conventional sputtering apparatus including no auxiliary electrode, the sputtering apparatus including the auxiliary electrode exhibits various practically important effects; for example, an increase in the temperature of the substrate can be greatly suppressed, a film can be formed at a low temperature, a film of very improved quality can be formed, and the film formation rate can be increased. The present inventor has also found that, when the auxiliary electrode is provided, the aforementioned objects are satisfactorily attained, and the sputtering apparatus exhibits remarkable effects in addition to the above-described effects. The auxiliary electrode, when viewed in a different light, is considered newly provided means for regulating film formation conditions. Therefore, the facing-targets sputtering apparatus of the present invention, which includes the newly provided film-formation-condition regulation means, exhibits enhanced flexibility; i.e., the apparatus can be applied to a variety of fields.

Furthermore, as shown in the below-described Experiments, the present inventor has found that, as compared with the case where a thin film is formed by use of the conventional box-shaped facing-targets sputtering apparatus, when the box-shaped facing-targets sputtering apparatus including the auxiliary electrode is employed, a compound thin film (specifically, an oxide thin film or a nitride thin film) can be formed on a substrate at a low temperature, film formation can be reliably performed while the substrate is allowed to stand at room temperature (i.e., without regulation of the substrate temperature), the thus-formed thin film exhibits improved quality, and the film formation rate is increased. The invention according to the second aspect has been accomplished on the basis of this finding.

In the sputtering apparatus of the present invention, no particular limitations are imposed on the position at which the auxiliary electrode is provided, so long as the electrode is located within the plasma confinement space. Preferably, the position of the auxiliary electrode is appropriately determined in accordance with the intended purposes. From the viewpoint of film formation at a low temperature, or from the viewpoint of film formation rate, preferably, the auxiliary electrode is provided at the center portion of the plasma confinement space; specifically, the electrode is provided on the center line parallel to the targets of the confinement space or in the vicinity of the center line, at which the electrode can effectively absorb excess electrons. From the viewpoint of enhancement of film quality, preferably, the auxiliary electrode is provided in a space in the vicinity of electron reflection means, in which the facing-mode magnetic field intersects with the magnetron-mode magnetic field, and thermalized electrons tend to remain. More preferably, the auxiliary electrode is provided so as to extend along the entire periphery of the electron reflection means.

From the viewpoint of further suppression of passing of thermalized electrons, etc. toward the substrate, preferably, the auxiliary electrode is provided in the vicinity of the opening of the sputtering unit. More preferably, the auxiliary electrode is provide so as to extend along the entire periphery of the opening and to substantially surround the opening.

No particular limitations are imposed on the electrical potential of the auxiliary electrode, so long as the electrode can absorb electrons. In general, the electrical potential of the auxiliary electrode is regulated to be equal to that of the anode, and is grounded. However, the electrical potential may be regulated to an appropriate positive value.

In the present invention, the auxiliary electrode exhibits its effects in the case where the plasma confinement space tends to be filled with electrons; i.e., in the case where plasma is strongly confined in the space. From the viewpoint of enhancement of the effects of the auxiliary electrode, the sputtering apparatus preferably includes yoke means which magnetically connects magnetic poles of the permanent magnets of each of the target units, the magnetic poles being located on the outward side of the unit (hereinafter the magnetic poles will be referred to as "open-side-facing magnetic poles"). Particularly, from the viewpoint of realization of a compact configuration, and prevention of the bad effects of thermalized electrons on the substrate or on a thin film to be formed on the substrate, preferably, the yoke means includes a pole section formed of a magnetic material which is provided on a support body of each of the target units so as to cover the magnetic poles of the permanent magnets, and a connection section formed of a magnetic material which is provided on a face of the box-shaped sputtering unit so as to magnetically connect the pole sections. More preferably, the connection section is formed of a plate having an opening, and is provided on the opening face of the box-shaped sputtering unit.

From the viewpoint of enhancement of confinement of plasma, preferably, the auxiliary electrode is employed in combination with a configuration in which magnetic-field regulation means for predominantly regulating a magnetron-mode magnetic field is provided on the back side of each of the targets, whereby confinement of plasma is enhanced by means of the magnetron-mode magnetic field.

The production method of the present invention is particularly effective for formation of a compound thin film (e.g., a metal oxide thin film or a metal nitride thin film), which is considered to be difficult to form by means of sputtering from the viewpoint of, for example, control of temperature or film formation rate. In the case where an oxide thin film is formed by means of the method of the present invention, preferably, film formation is carried out by use of a target predominantly containing an oxide which constitutes the thin film, and a sputtering gas containing oxygen in an amount of 1 vol. % or less, from the viewpoints of prevention of the bad effects of the reactive gas on an underlying layer and stability of the sputtering process. The method of the present invention is particularly effective for formation of an oxide thin film on a surface layer which is susceptible to oxidation, such as a silver film or an organic film. In the case where a nitride thin film is formed by means of the method of the present invention, preferably, film formation is carried out by use of a nitrogen-containing inert gas serving as a sputtering gas and containing oxygen in an amount of 1 vol. % or less, and a target predominantly containing elements which constitute the thin film and not containing the components of the gas, from the viewpoints of low-temperature film formation, film formation rate, and film quality.

The method of the present invention is preferably applied to production of semiconductor devices and flat panel displays, particularly, organic devices such as an organic semiconductor device and an organic EL. The method of the present invention exhibits remarkable effects in the case where a substrate on which a film is to be formed by means of the method or a surface layer of the substrate is formed of an organic substance, or in the case where the method is employed for producing a functional thin film requiring a densely packed non-damaged interface, such as a transparent heat-insulating film formed of a multi-layer thin film.

As described above, the present invention provides the box-shaped facing-targets sputtering apparatus which can form a film exhibiting greatly improved quality at a considerably low temperature, as compared with the case where a film is formed by means of the conventional sputtering apparatus. The sputtering apparatus of the present invention has been achieved by providing an auxiliary electrode in the plasma confinement space of the conventional box-shaped facing-targets sputtering unit. The sputtering apparatus can be widely applied to formation of thin films which are considered to be difficult to form by means of sputtering; for example, an electrode layer of an organic EL display, etc., various thin films of semiconductor devices, and highly functional thin films such as a transparent heat-insulating film. Particularly, the sputtering apparatus exhibits great effects in the case where a film is formed, by use of the apparatus, on an underlying layer (e.g., an organic substance layer or a functional layer) whose function would be impaired when heat is applied thereto or when high-energy particles collide therewith.

The foregoing and other objects of the present invention, together with its novel features, will become more apparent when the following detailed description is read with reference to the accompanying drawings.

DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiment

Figure 1:
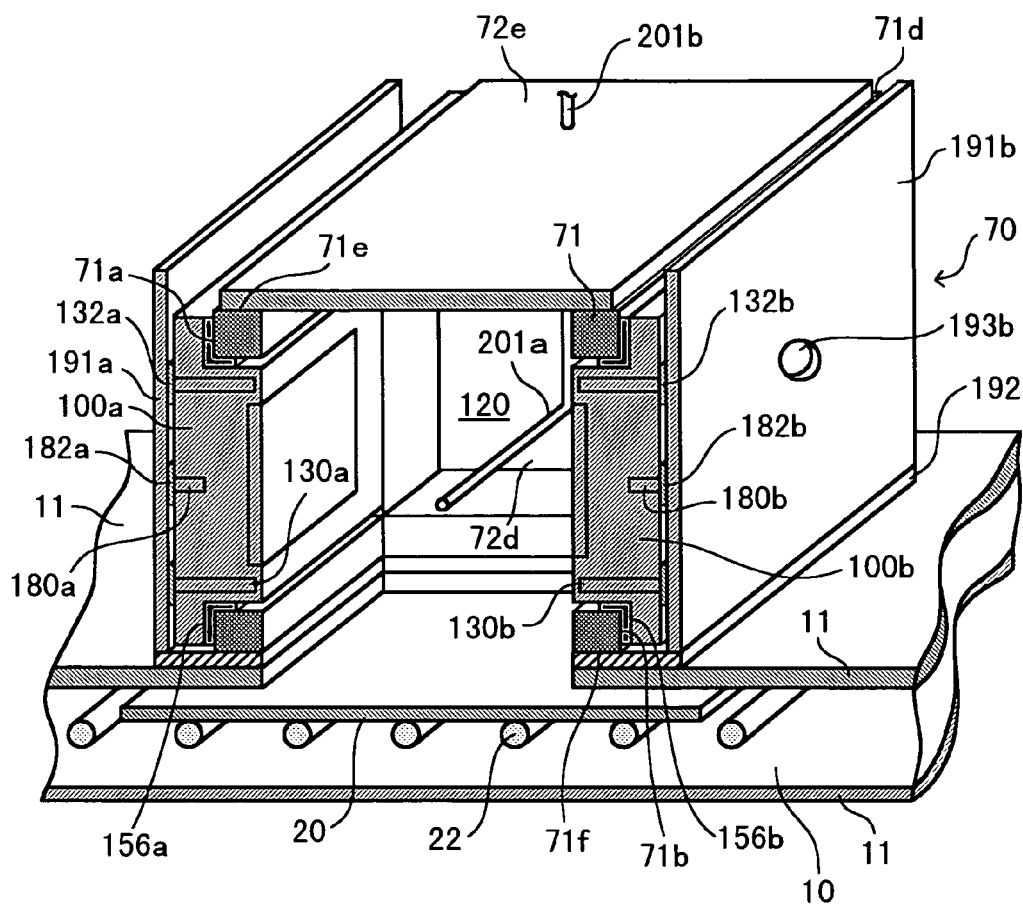
FIG. 1 is a perspective view showing a box-shaped facing-targets sputtering apparatus according to an embodiment of the present invention, with a portion of the apparatus being illustrated by a cross-sectional view.

FIG. 1 is a schematic perspective view showing the box-shaped facing-targets sputtering apparatus according to an embodiment of the present invention, with a portion of the apparatus being illustrated by a cross-sectional view. Unlike the case of the conventional facing-targets sputtering apparatus in which target units 100a and 100b are mounted directly on a chamber wall 11 of a vacuum chamber 10, in the box-shaped facing-targets sputtering unit (hereinafter will be referred to simply as "box-shaped unit") 70 of the present embodiment, the target units 100a and 100b are hermetically mounted on opposing faces 71a and 71b (see FIG. 1) of a rectangular parallelepiped frame 71, respectively, and faces 71c through 71e (a face 71c located on the front side is not illustrated), excluding an opening face 71f which is located on the bottom side and which faces a substrate 20, are hermetically covered by use of closure plates 72c through 72e (the closure plate 72c corresponding to the face 71c located on the front side is not illustrated), respectively; i.e., the faces excluding the opening face 71f are hermetically shielded. Since the facing-targets sputtering apparatus has such a compact configuration, maintenance of the apparatus is improved, and the apparatus is suitable for industrial-scale production at high productivity.

The sputtering apparatus of the present invention will next be described in detail with reference to the appended drawings. In FIG. 4, which is a schematic horizontal cross-sectional view of the target unit shown in FIG. 3, as taken along line B—B, illustration of a pole section 191a is omitted. The target units 100a and 100b will now be described in detail with reference to FIGS. 2 through 4.

Figure 2:
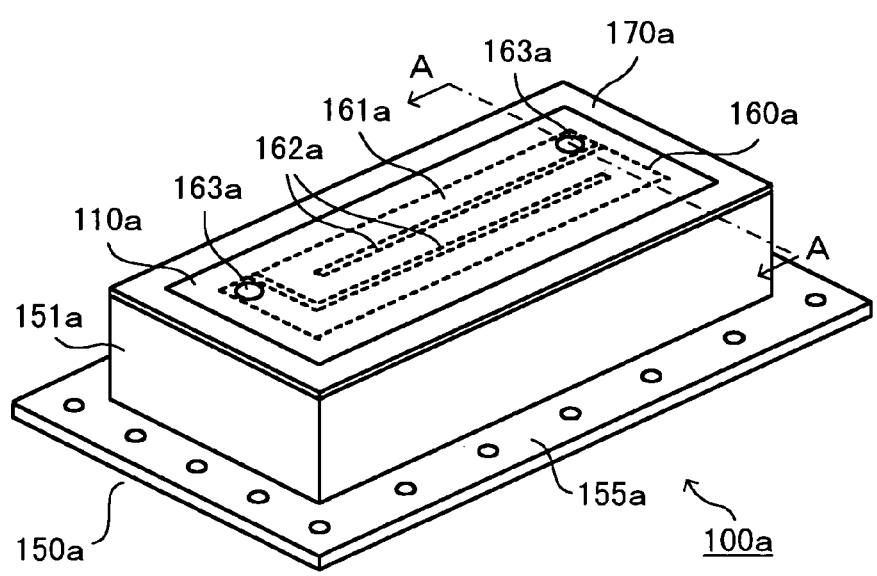
FIG. 2 is a schematic perspective view showing a target unit of the sputtering apparatus according to the embodiment of the present invention.
Figure 3:
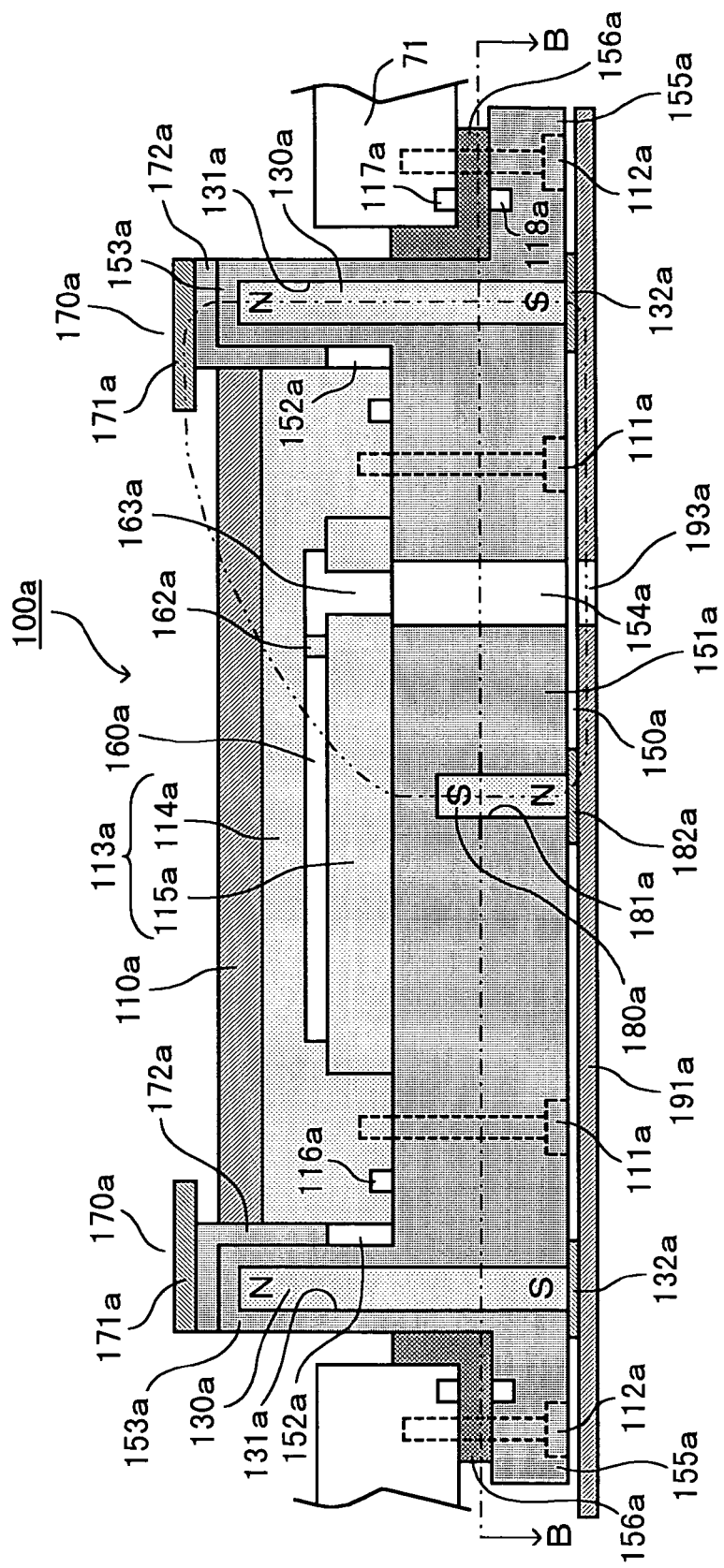
FIG. 3 is a schematic vertical cross-sectional view of the target unit shown in FIG. 2, as taken along line A—A.
Figure 4:
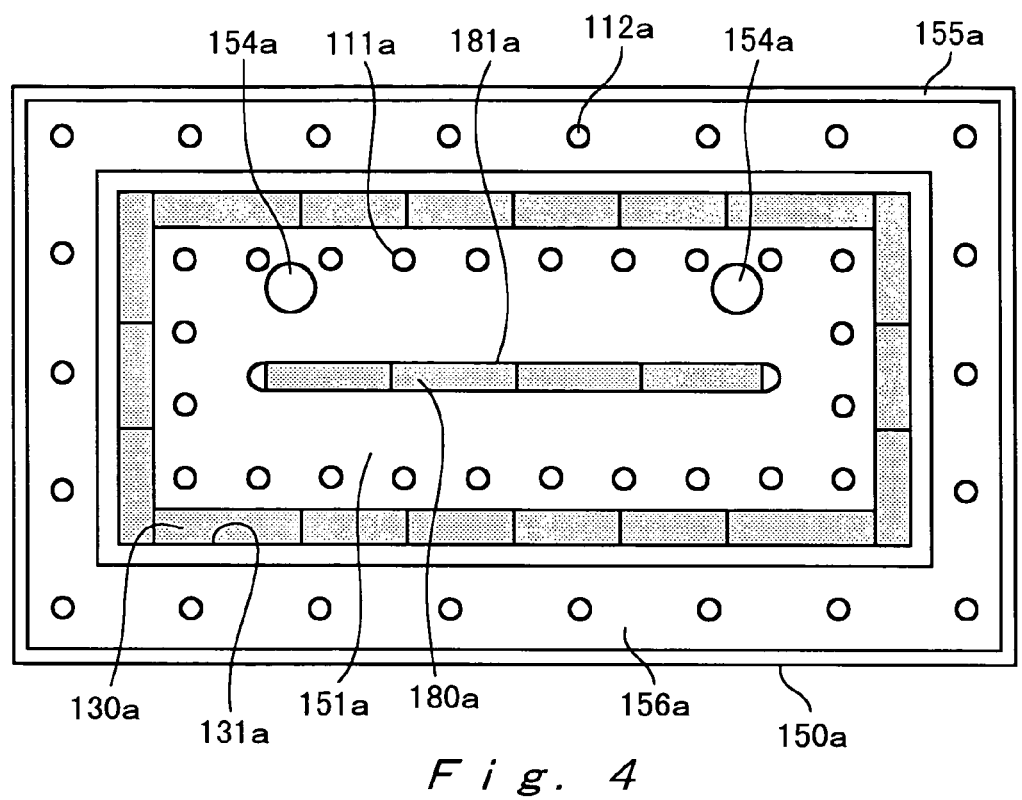
FIG. 4 is a schematic horizontal cross-sectional view of the target unit shown in FIG. 3, as taken along line B—B.

As is clear from FIGS. 2 through 4, the basic configuration of the target units 100a and 100b is the same as that of a target unit disclosed in Japanese Patent Application Laid-Open (kokai) No. 10-330936, except for magnetic-field regulation means and yoke means. As shown in FIGS. 2 through 4, the facing target units 100a and 100b are removably mounted on the frame 71. FIGS. 2 through 4 show the configuration of the target unit 100a. The target units 100a and 100b have the same configuration, except that the N and S magnetic poles of a permanent magnet 130a serving as magnetic-field generation means and a permanent magnet 180a serving as magnetic-field regulation means are reversed. Therefore, detailed drawings of the target unit 100b are omitted.

As is clear from FIG. 2, the target unit 100a is exchangeably mounted on the frame 71 by means of a flange 155a of a support unit 150a. As described below, the target unit 100a includes a support module and a target module.

As shown in FIG. 3, the target module includes a target 110a, a backing unit 113a, and electron reflection means 170a, and the target module is exchangeably mounted, by means of bolts 111a arranged at certain intervals, on a receiving section 152a formed on the front side of the support unit 150a constituting the support module.

Unlike the case of the sputtering apparatus disclosed in Japanese Patent Application Laid-Open (kokai) No. 10-330936, in the present embodiment, a cooling jacket 160a is provided inside the backing unit 113a. Specifically, the cooling jacket 160a is formed as follows: a hollow section having separation walls 162a for forming a cooling trench 161a having a shape represented by a dotted line of FIG. 2 is formed beneath a thick, plate-like backing main body 114a such that the size of the hollow section becomes equal to that of the target 110a as possible; and a lid 115a having a connection port 163a which connects to the cooling trench 161a is welded to the hollow section, to thereby close the hollow section. The backing unit 113a and the separation walls 162a are formed of a thermally conductive material (specifically, copper in the present embodiment). A synthetic-resin-made tube (not illustrated) is provided by way of through-holes 154a and 193a and connected to the connection port 163a by use of a connection tool such that cooling water flows through the cooling jacket 160a.

The target 110a is affixed to the front surface of the backing unit 113a by use of a thermally conductive adhesive material (specifically, indium in the present embodiment), and, as shown in FIG. 3, the electron reflection means 170a is mounted on the side wall of the backing unit 113a by means of screws (not illustrated), to thereby form the target module. The electron reflection means 170a is formed of a ferromagnetic material (specifically, an iron plate in the present embodiment) such that the means 170a can also serve as the magnetic pole of the magnetic-field generation means. As shown in FIG. 3, the electron reflection means 170a includes an electron reflection plate 171a having a width so as to face the peripheral edge of the target 110a. The electron reflection plate 171a is provided so as to cover the front surface of a peripheral wall 153a of the support unit 150a in which the magnetic generation means is accommodated. The plate 171a is supported by a mounting parts 172a having an L-shaped cross section and being formed of copper (i.e., thermally conductive material). Therefore, the electron reflection plate 171a is effectively cooled via the mounting parts 172a. No particular limitations are imposed on the electron reflection plate 171a, so long as the plate 171a reflects electrons approaching the front surface of the permanent magnet 130a provided outside the target 110a (i.e., the front surface of the peripheral wall 153a). In some cases, the plate 171a may be sputtered. Therefore, preferably, the plate 171a is formed of the same material as the target 110a. When the plate 171a is formed of a non-magnetic material, as in the case where the electron reflection means is not provided, the permanent magnet 130a is preferably provided such that the N pole of the magnet 130a projects toward the interior of the vacuum chamber by a predetermined length as measured from the front surface of the target 110a. In the below-described Experiments, the sputtering apparatus having this configuration was employed for film formation, and the electron reflection plate 171a was formed of the same material as the target 110a.

As shown in FIG. 3, the target module is mounted on the receiving section 152a formed at the front surface of the support main body 151a by means of the bolts 111a arranged at certain intervals, such that the back surface of the backing unit 113a comes into direct contact with the surface of the receiving section 152a. In FIG. 3, reference numeral 116a denotes an O ring for vacuum sealing. By means of the O ring, vacuum sealing between the target module and the support unit 150a is attained. Since the cooling jacket 160a is sealed through welding, and sealing between the support unit 150a and the target module is maintained by means of the O ring 116a, leakage of cooling water into the vacuum chamber is prevented. In addition, since the O ring is separated from the cooling jacket, deterioration of sealing performance with passage of time caused by direct contact between the O ring and cooling water—such a problem arises in the conventional box-shaped facing targets sputtering apparatus—can be prevented, whereby reliability and maintenance are improved. The support unit 150a may be formed of an inexpensive material of light weight, such as aluminum.

The support module includes the support unit 150a, which is formed from a thermally conductive material (specifically, an aluminum block in the present embodiment) through machining. The flange 155a constituting the support unit 150a is hermetically mounted on the frame 71 by means of bolts 112a arranged at certain intervals, via a packing 156a formed of an electrically insulating material (specifically, a heat-resistant resin in the present embodiment) and O rings 117a and 118a for vacuum sealing.

As shown in FIG. 2, the support unit 150a includes the support main body 151a having a rectangular parallelepiped shape, and the flange 155a having a predetermined width such that the flange can be mounted on the frame 71. The receiving section 152a on which the target module is to be mounted is formed on the front surface of the support main body 151a, and, as shown in FIG. 3, an accommodation section 131a for accommodating a permanent magnet 130a serving as magnetic-field generation means is provided in the peripheral wall 153a surrounding the receiving section 152a. As described above, the electron reflection means 170a is provided on the front surface of the peripheral wall 153a. In the case where the electron reflection means 170a is not provided, even when the target 110a is formed of a magnetic material, preferably, the peripheral wall 153a is provided such that the front end portion of the permanent magnet 130a projects into the interior of the vacuum chamber by a predetermined length as measured from the front surface of the target 110a, and that the magnetron-mode magnetic field is reliably generated in the vicinity of the peripheral edge of the target 110a.

As shown in FIGS. 3 and 4, the accommodation section 131a has an outwardly opened hole of predetermined depth such that the permanent magnet 130a serving as the magnetic-field generation means can be placed thereinto from the outside of the vacuum chamber. The permanent magnet 130a is provided into the hole of the accommodation section 131a such that the magnetic poles of the magnet 130a are arranged as shown in FIG. 3. In the present embodiment, the permanent magnet 130a is formed of a commercially available permanent magnet (e.g., AlNiCo magnet) of predetermined length and width. As shown in FIGS. 3 and 4, a predetermined number of the permanent magnets 130a are provided so as to surround the target 110a. In the present embodiment, the permanent magnet 130a is fixed to the accommodation section by means of an electrically insulating material (specifically, a fixation plate 132a formed of a thin resin plate).

Thus, complete sealing between the permanent magnet 130a and the vacuum chamber 10 is maintained, and the permanent magnet 130a is thermally connected to the cooling jacket 160a via the backing section 113a and the thermally conductive support main body 151a with which the permanent magnet 130a is in direct contact. Therefore, the permanent magnet 130a is effectively cooled. Thus, contamination of the vacuum chamber 10 with impurity gasses from the permanent magnet 130a (such a problem has arisen in the conventional sputtering apparatus) is prevented, and deterioration of the permanent magnet 130a with passage of time is considerably reduced, resulting in improved reliability, long-term stability, and maintenance. In this sputtering apparatus, there are obtained cooling effects substantially comparable to those obtained by the conventional box-shaped facing-targets sputtering apparatus in which a cooling jacket is provided at the interface between a support main body and a backing section.

In the sputtering apparatus shown in FIG. 1, which has the above-described configuration, the permanent magnet 130a and the permanent magnet 130b provided in the target unit 100b, which faces the target unit 100a, generate the magnetic fields for confinement of plasma; i.e., the facing-mode magnetic field extending in the direction perpendicular to the targets 110a and 110b in such a manner as to surround a confinement space 120, and the arcuate magnetron-mode magnetic field in the direction parallel to the target 110a, which extends from the peripheral edge of the electron reflection plate 171a, the peripheral edge facing the target 110a, toward the center portion of the target 110a. The facing-mode magnetic field dominates sputtering of the center portion of the target 110a, whereas the magnetron-mode magnetic field dominates sputtering of the peripheral portion of the target 110a. As a result, the entire surface of the target is almost uniformly sputtered, as compared with the case of a typical conventional sputtering method; i.e., a planar-magnetron-type sputtering method.

In the present embodiment, as shown in FIGS. 3 and 4, magnetic-field regulation means for regulating mainly the magnetron-mode magnetic field is provided as described below. A trench 181a of predetermined depth and width is provided on the back side of the support main body 151a of the support unit 150a at a position on the centerline of the main body 151a that is parallel to the substrate. The trench 181a is provided for mounting therein permanent magnets 180a serving as the magnetic-field regulation means. In the present embodiment, the trench 181a is provided so as to extend in the width direction of the target 110a such that the position of the permanent magnets 180a serving as the magnetic-field regulation means can be readily regulated in accordance with change in, for example, the materials employed in the target 110a. In the present embodiment, in order to enhance the intensity of the entire magnetron-mode magnetic field, as shown in FIG. 4, the plate-like permanent magnets 180a of predetermined length, serving as the magnetic-field regulation means, are disposed in all of the trench 181a, and the magnets 180a are fixed to the trench 181a by means of a fixation plate 182a formed of a thin resin plate, which is employed for forming the fixation plate 132a. In the present embodiment, as shown in FIG. 3, the permanent magnet 180a serving as the magnetic-field regulation means and the permanent magnet 130a serving as the magnetic-field generation means are magnetically connected, via the fixation plates 182a and 132a, to a pole section 191a of the below-described yoke means.

As shown by a two-dot chain line of FIG. 3, the magnetron-mode magnetic field extends from the N pole of the permanent magnet 130a serving as the magnetic-field generation means, via the electron reflection plate 171a and the target 110a, to the S pole of the permanent magnet 180a serving as the magnetic-field regulation means. Furthermore, the magnetron-mode magnetic field extends from the N pole of the permanent magnet 180a, via the fixation plate 182a, the pole section 191a, and the fixation plate 132a, to the S pole of the permanent magnet 130a serving as the magnetic-field generation means.

Unlike the case of the conventional facing-targets sputtering apparatus including no magnetic-field regulation means, the magnetron-mode magnetic field extending in the vicinity of the front surface of the target 110a can be regulated by means of the magnetic-field regulation means. Therefore, confinement of plasma at the peripheral edge of the target, which is dominated by the magnetron-mode magnetic field, can be regulated separately from plasma confinement dominated by the facing-mode magnetic field, whereby the target can be uniformly eroded, and a thin film can be formed so as to attain a uniform thickness in the width direction.

Conceivable reasons why such effects are obtained by means of the magnetic-field regulation means are described below. By means of the magnetic-field regulation means, the magnetron-mode magnetic field extends to the center portion of the target. Therefore, interaction between the facing-mode magnetic field and the magnetron-mode magnetic field becomes strong in the vicinity of the position at which the magnetic-field regulation means is provided. As a result, confinement of plasma is locally enhanced, and sputtering rate (i.e., film thickness) is regulated. In particular, such effects are remarkable at both ends of the rectangular target in its longitudinal direction. Therefore, as described in the present embodiment, when the magnetic-field regulation means is provided so as to extend along the entirety of the center portion of the target, the area of a longitudinal region of the target in which the target is uniformly eroded is increased. When the intensity of the magnetron-mode magnetic field is regulated, interaction between the facing-mode magnetic field and the magnetron-mode magnetic field is also regulated. Therefore, local regulation of sputtering rate can be attained. The extension direction of the magnetron-mode magnetic field, the degree of extension of the magnetic field, or the intensity of the magnetic field is appropriately determined in accordance with purposes for sputtering.

When the magnetic-field regulation means is configured as described above, the entire surface of the target is uniformly eroded. As described above, when the conventional facing-targets sputtering apparatus is employed, the degree of erosion of a first pair of diagonal corners of a rectangular target somewhat differs from that of a second pair of diagonal corners of the target. In contrast, when the sputtering apparatus of the present embodiment is employed, by virtue of the magnetic-field regulation means, such difference does not arise, and utilization efficiency of the target is enhanced by about 10%. This effect greatly contributes directly to reduction of film formation costs and realization of industrial-scale production.

The magnetic-field regulation means can regulate merely the intensity of the magnetron-mode magnetic field. As described below, when the magnetic-field regulation means is employed in combination with yoke means, the regulation means exerts remarkable effects of optimizing distribution of the magnetic fluxes of the facing-mode and magnetron-mode magnetic fields for confinement of plasma.

As is clear from the above description, no particular limitations are imposed on the magnetic-field regulation means, so long as the regulation means can regulate the magnetron-mode magnetic field for confining plasma in the vicinity of the front surface of the target 110a. Therefore, the magnetic-field regulation means may be formed of, instead of a permanent magnet, a magnetic material of high magnetic permeability or a similar material. The position at which the magnetic-field regulation means is provided and the intensity of a magnet to be employed are affected by various factors, including the material of the target and the size and arrangement of components provided around the target. Therefore, preferably, the position of the magnetic-field regulation means, etc. are determined on the basis of test data and simulation using the data.

As described above, the entirety of the target unit 100a is provided on the support unit 150a. The flange 155a of the target unit 100a is mounted on the frame 71, via the O rings 117a and 118a for vacuum sealing formed of an electrically insulating material (specifically a heat-resistant resin), by means of bushes (not illustrated) formed of an electrically insulating material and the bolts 112a arranged at certain intervals. Thus, as shown in FIG. 1, the target unit 100a is hermetically mounted on the frame 71 in an electrically insulating manner, whereby the below-described box-shaped unit 70 is configured.

The box-shaped unit 70 includes the rectangular parallelepiped frame 71 formed of aluminum. The above-described target units 100a and 100b are hermetically mounted on, via the packings 156a and 156b, the faces 71a and 71b of the frame 71, respectively, such that the target units are electrically insulated from the frame 71. Closure plates 72c through 72e are hermetically mounted on the faces 71c through 71e, excluding the opening face 71f which faces the substrate 20, by means of bolts (not illustrated) and via O rings (not illustrated) (the face 72c and the closure plate 72c corresponding to the face 72c are not illustrated). No particular limitations are imposed on the material of the closure plates 72c through 72e, so long as the plates exhibit thermal resistance, and vacuum sealing is attained by means of the plates. Therefore, the closure plates 72c through 72e may be formed of a general structural material. In the present embodiment, the closure plates 72c through 72e are formed of aluminum, which is employed for forming the frame 71. If desired, a cooling tube or the like is provided outside each of the closure plates 72c through 72e for cooling the closure plate.

As shown in FIG. 1, the box-shaped unit 70 includes the below-described yoke means for connecting the open-side facing magnetic poles of the facing permanent magnets 130a and 130b, thereby forming a closed magnetic circuit. Specifically, the yoke means includes rectangular pole sections 191a and 191b formed of a ferromagnetic material (specifically, an iron plate in the present embodiment), and a connection section 192 for magnetically connecting the pole sections 191a and 191b. The pole section 191a is provided so as to cover the entire back face of the support main body 151a on which the fixation plate 132a of the permanent magnet 130a of the target unit 10a and the fixation plate 182a of the permanent magnet 180a serving as the magnetic-field regulation means are mounted, and the pole section 191b is provided so as to cover the entire back face of the support main body 151b on which the fixation plate 132b of the permanent magnet 130b of the target unit 100b and the fixation plate 182b of the permanent magnet 180b serving as the magnetic-field regulation means are mounted. The connection section 192 is formed of an iron plate having an opening, and is provided so as to cover the entirety of the opening face 71f except the opening. In the present embodiment, as shown in FIG. 1, both lower ends of the pole sections 191a and 191b are connected to the connection section 192. The pole sections 191a and 191b and the connection section 192 can be mounted on the box-shaped unit in a sufficiently strong manner by means of magnetic forces of the permanent magnets 130a and 130b. However, in the present embodiment, from the viewpoint of safety, the sections 191a, 191b, and 192 are fixed to the box-shaped unit by means of, for example, screws (not illustrated).

In the above-described sputtering apparatus, the pole sections 191a and 191b are electrically insulated from the back surfaces of the target units 100a and 100b, and the yoke means is electrically connected to the frame 71 by means of the connection section 192. Therefore, when the yoke means is electrically grounded, all the faces of the box-shaped unit 70 which are present outside the vacuum chamber 10 are electrically grounded. The sputtering apparatus of the present embodiment exhibits safety and has a simple configuration (i.e., assembly of plate-like bodies), and is readily applied to an existing box-shaped unit. This configuration is particularly preferred from the viewpoint of protection of an underlying layer from any damage, since leakage of magnetic field to the substrate is reduced. In the configuration of the present embodiment, the connection section 192 is hermetically mounted, via O rings (not illustrated), on the frame 71 by means of bolts (not illustrated), and the box-shaped unit 70 combined with the connection section 192 is hermetically fixed to the chamber wall 11 via O rings (not illustrated). From the viewpoint of reduction of leakage of magnetic field to the outside, preferably, the pole sections 191a and 191b are formed of plate-like bodies so as to cover all the corresponding faces of the unit 70 as in the case of the present embodiment, and the plate-like connection section is provided on the faces other than the faces on which the pole sections are provided, to thereby cover all the faces of the unit 70 with the yoke means. No particular limitations are imposed on the yoke means, so long as the yoke means can magnetically connect the open-side facing magnetic poles of the permanent magnets 130a and 130b that are opposite the facing magnetic poles thereof, to thereby form a substantially closed magnetic circuit. Therefore, the pole section and the connection section are not necessarily formed of a plate-like body capable of covering all the faces of the box-shaped unit, and a micro air-gap may be present between the magnetic poles and the pole section, or between the pole section and the connection section. Although the connection section 192 is provided on the opening face in the present embodiment, the connection section may be provided along any of the faces other than the opening face.

As shown in FIG. 1, the box-shaped unit 70 is hermetically mounted on the chamber wall 11 of the vacuum chamber 10 via the connection section 192 of the yoke means such that the opening of the unit 70 (i.e., the opening face 71f of the frame 71) faces the vacuum chamber 10. Therefore, the vacuum chamber 10 is electrically connected to the frame 71 by means of attachment bolts. The facing-targets sputtering apparatus of the present embodiment is configured such that film formation is performed while the substrate 20 is conveyed. Although not illustrated in FIG. 1, a known substrate feed chamber and a known substrate removal chamber are connected to the vacuum chamber 10 at the upstream and downstream sides of the chamber, so that film formation can be performed while the substrate 20 is conveyed by means of conveying rollers 22 at a predetermined rate. Needless to say, film formation can be performed while the substrate 20 is stopped at a position directly below the opening of the box-shaped unit. In the below-described Experiments, film formation was performed while the substrate 20 was stopped.

Figure 7:
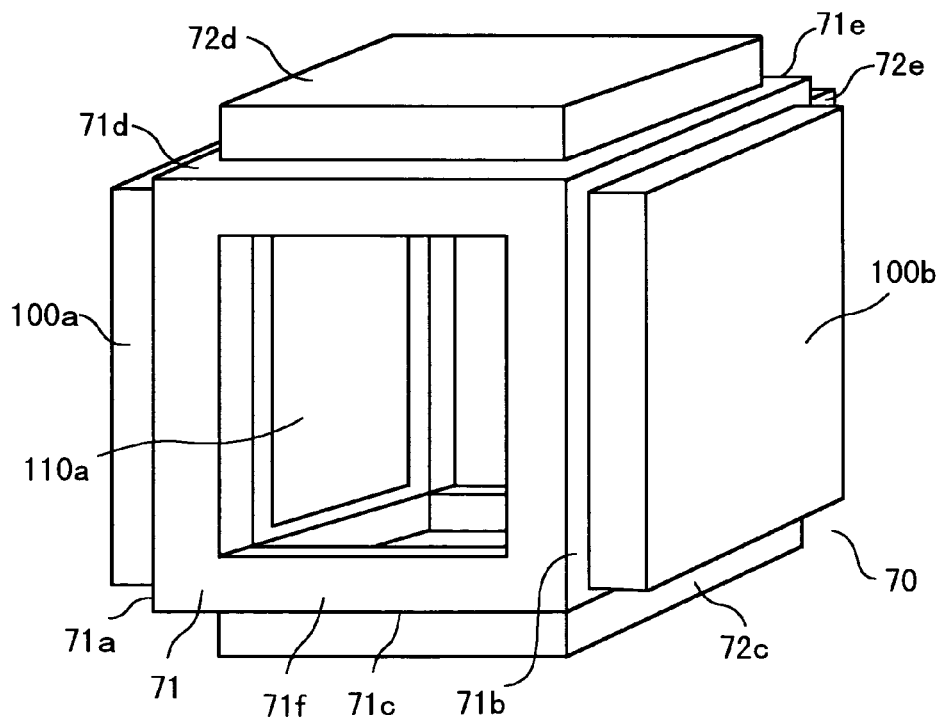
FIG. 7 is a perspective view showing a conventional box-shaped facing-targets sputtering unit.

In the box-shaped unit 70 having the above-described configuration, the facing targets 110a and 110b are disposed a predetermined distance away from each other, and the magnetic fields for confining plasma are generated as in the case of the conventional sputtering apparatus shown in FIG. 7. Therefore, when a sputtering power supply is connected to the chamber wall 11 of the vacuum chamber 10 serving as an anode and to the target units 100a and 100b serving as a cathode, and sputtering power is supplied, sputtering of the targets is performed as in the case of the conventional sputtering apparatus.

In the sputtering apparatus of the present embodiment, since all the sides of the confinement space 120, excepting the opening face 71f facing the substrate, are covered by the closure plates, sputtered particles transfer merely through the opening (i.e., the face 71f) toward the substrate 20 provided in the vacuum chamber 10. Therefore, as compared with the case of a conventional side-opened-type sputtering target in which the sides of the confinement space are opened, dispersion of sputtered particles to a portion other than the substrate within the vacuum chamber 10 is reduced, and thus utilization efficiency of the target and maintenance of the apparatus are improved. Even in the case where a plurality of the box-shaped units 70 are arranged, when intervals therebetween are regulated to some cm or more, interaction between the box-shaped units can be substantially prevented, and thus formation of a multi-layer film can be attained by means of the sputtering apparatus of compact configuration. As is clear from FIG. 1, unlike the case of the conventional sputtering apparatus, in the sputtering apparatus of the present embodiment, the sputtering unit has a box-shaped compact configuration, and is provided outside the vacuum chamber 10. Therefore, the size of the vacuum chamber for accommodating and conveying the substrate is greatly reduced, and thus maintenance of the apparatus is improved. In addition, since the capacity of the vacuum chamber is reduced, the time required for evacuation of the chamber is reduced; i.e., equipment operation efficiency is improved, resulting in reduction of equipment costs and improvement of productivity.

In the present embodiment, the yoke means is provided. Therefore, as described above, as compared with the case of the conventional sputtering apparatus including no yoke means, the intensity of the facing-mode magnetic field increases, and the intensity of the magnetic field extending from the end portion of the opening to the outside of the box-shaped unit 70 decreases. Because of such change in the intensity of the magnetic fields, confinement of plasma within the confinement space, particularly confinement of plasma at the opening, is enhanced, and the intensity of the outwardly extending magnetic field which induces electrons, etc. to the substrate lowers. Therefore, leakage of plasma, electrons, etc. to the substrate is reduced, and thus film formation can be performed at a low temperature as compared with the case of the conventional sputtering apparatus, and damage to an underlying layer can be reduced. Furthermore, since confinement of plasma is enhanced, film formation can be performed under higher vacuum, and a film of high quality containing small amounts of impurities can be formed.

In the sputtering apparatus including the yoke means, the distribution of the magnetic field which extend within the box-shaped unit 70 along a direction parallel to the target surfaces (i.e., the distribution of the magnetron-mode magnetic field) varies in accordance with lowering of the intensity of the magnetic field which extends to the outside of the opening. Since the sputtering apparatus of the present embodiment includes the magnetic-field regulation means which can regulate merely the magnetron-mode magnetic field, the aforementioned magnetic field distribution can be regulated by means of the magnetic-field regulation means (specifically, the permanent magnets 180a and 180b), whereby the magnetic field distribution can be optimized. As described above, when the magnetic-field regulation means is employed in combination with the yoke means, the distribution of the magnetic field for confinement of plasma can be regulated so as to be suitable for formation of various films. Depending on a film to be formed, effects of change in the magnetic field distribution may be substantially neglected, and in such a case, regulation of the magnetic field distribution by means of the magnetic-field regulation means is not required. The magnetic field distribution must be regulated so as to be suitable for a film to be formed. In general, regulation of the magnetic field distribution is determined in a preproduction stage. However, regulation of the magnetic field distribution may be determined on the basis of simulation using test data.

As described above, in the box-shaped unit, confinement of electrons is enhanced within the confinement space of the unit, as compared with the case of the conventional side-opened-type sputtering apparatus. Particularly when confinement of plasma is enhanced, confinement of electrons is considerably enhanced, leading to leakage of thermalized electrons from the opening of the box-shaped unit. Such a problem becomes particularly apparent when a metal oxide film or a similar film is formed by means of reactive sputtering.

Figure 5:
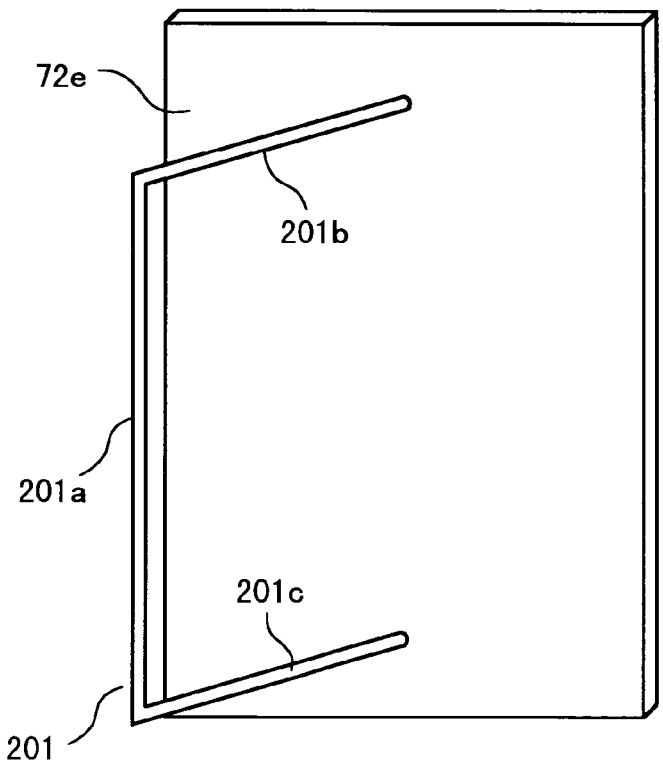
FIG. 5 is a perspective view showing an auxiliary electrode employed in the embodiment of the present invention.

In view of the foregoing, the sputtering apparatus of the present embodiment, which has the above-described configuration, further includes an auxiliary electrode for absorbing electrons directly from the plasma confinement space, which is a characteristic feature of the present invention. The auxiliary electrode is provided as described below. In the present embodiment, as shown in FIG. 1, the auxiliary electrode is formed of a rod-like electrode 201 which is provided on the center line within the plasma confinement space of the box-shaped unit, or in the vicinity of the center line, the center line extending along a direction parallel to the targets. Specifically, as shown in FIG. 5, the rod-like electrode 201 includes a straightly extending main body 201a of predetermined length and support legs 201b and 201c which support the main body, and the electrode 201 has a U-shaped configuration. The support legs 201b and 201c are mounted in the closure plate 72e which covers the face 71e facing the opening face 71f, and the support legs 201b and 201c have a predetermined length such that the main body 201a can be provided at a predetermined position. Specifically, the length of each of the support legs 201b and 201c is regulated such that, when the closure plate 72e is mounted on the frame 71, the main body 201a is located in the vicinity of the aforementioned center line which extends within the plasma confinement space in a direction perpendicular to the feed direction of the substrate 20. In the present embodiment, the main body 201a and the support legs 201b and 201c are formed of a single, continuous copper pipe. As shown in FIG. 1, the support legs 201b and 201c penetrate the closure plate 72e and extend to the outside, so that the copper pipe can be cooled by means of forced circulation of cooling water supplied from the outside. The support legs 201b and 201c are hermetically mounted in the closure plate 72e by means of welding.

Figure 6:
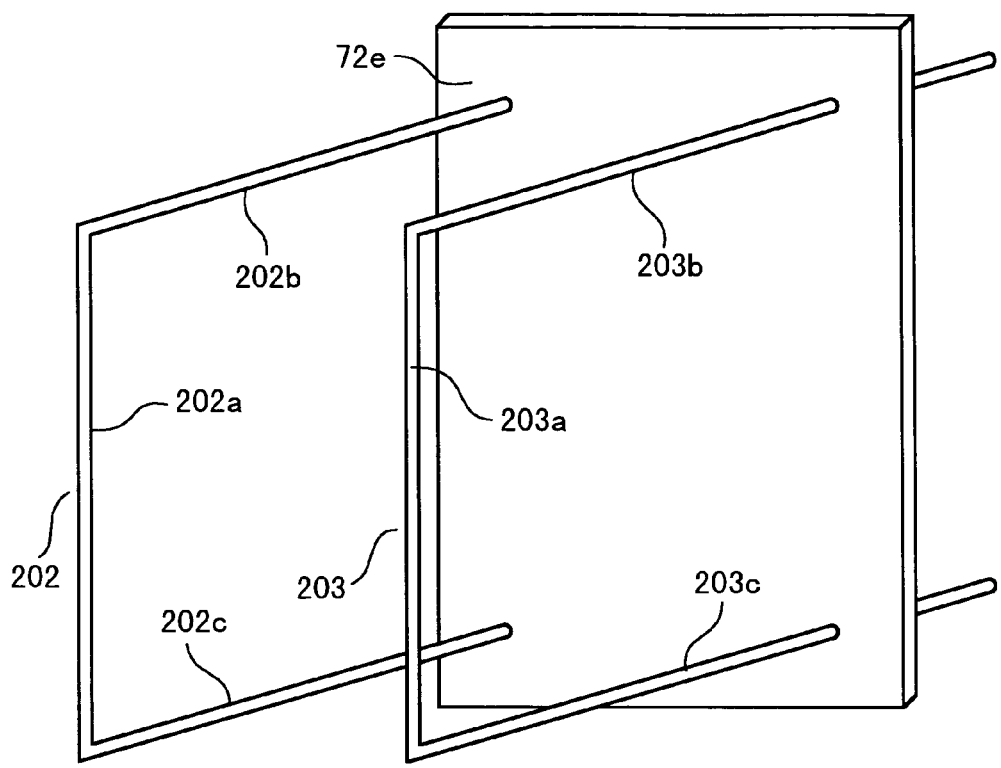
FIG. 6 is a perspective view showing an auxiliary electrode employed in the embodiment of the present invention.

No particular limitations are imposed on the arrangement and size of the auxiliary electrode. In the above-described embodiment, the auxiliary electrode is provided at the center portion of the plasma confinement space at which excess electrons including thermalized electrons are considered to be absorbed in the electrode in a most effective manner. However, from the viewpoint of effective absorption of thermalized electrons, preferably, as shown in FIG. 6, two rod-like electrodes 202 and 203 formed of the copper pipe of U-shaped configuration are provided at both end portions of the closure plate 72e in a direction perpendicular to the targets. In this case, the lengths of a main body 202a and support legs 202b and 202c constituting the rod-like electrode 202, and the lengths of a main body 203a and support legs 203b and 203c constituting the rod-like electrode 203 are regulated such that these electrodes are located in the vicinity of the front surface of the electron reflection plate 171a provided so as to surround the targets, in which thermalized electrons tend to remain.

When these auxiliary electrodes were provided, emission of light, which occurs when electrons remain in the plasma confinement space, was found to be considerably reduced, and an increase in the temperature of the substrate during the course of film formation was found to be suppressed. Furthermore, as compared with the case where film formation was performed by use of the conventional sputtering apparatus including no auxiliary electrode, when film formation was performed by use of the sputtering apparatus of the present embodiment under the almost same conditions as those for the above conventional film formation, in some cases, surprisingly, the quality of the resultant film was found to be improved, and the film formation rate was found to be increased.

When the method for producing a compound thin film of the present invention, in which film formation is performed by use of the box-shaped facing-targets sputtering apparatus including the aforementioned auxiliary electrode, is employed for formation of a compound thin film such as a metal oxide thin film, a film of high quality can be reliably formed on an organic film substrate exhibiting low thermal resistance, such as a polyester film substrate, while the substrate is allowed to stand at room temperature.

Therefore, the method of the present invention is particularly effective for forming, for example, an electrode or a protective film on an organic substance layer required for producing organic EL devices, etc. Examples of the electrode to which the method can be effectively applied include an indium tin oxide (ITO) electrode and zinc oxide electrode. Examples of the protective film to which the method can be effectively applied include a silicon oxide film and a silicon nitride film. Examples of the substrate to which the method can be effectively applied include a substrate on which an organic substance layer is formed, a plastic plate formed of a polyester or the like, and a plastic film.

In the case where an oxide thin film is formed by means of the method of the present invention, even when the concentration of oxygen is maintained at a very low level, a compound film of high quality is formed. When the method of the present invention is employed, even if the oxygen concentration is maintained at 1 vol. % or less, a film of sufficient quality is formed. Therefore, the method exhibits great effects of preventing impairment of an underlying layer caused by oxygen employed during the course of film formation, and of preventing adverse effects of the underlying layer on a layer which is continuously laminated on the underlying layer. From the viewpoint of prevention of such problems, the oxygen concentration is preferably 1 vol. % or less. The method of the present invention is advantageously applied to formation of a transparent, electrically conductive oxide film, since, when a sputtering target predominantly containing the target oxide and exhibiting appropriate electrical conductivity is employed, a film exhibiting excellent transparency and electrical conductivity can be formed at a relatively high film formation rate.

As described below, films were formed by means of the production method of the present invention (Working Examples), and films were formed by use of a conventional sputtering apparatus including no auxiliary electrode (Comparative Examples).

Experiment 1

In Working Example 1, a silicon nitride film containing a minute amount of oxygen was formed on a glass substrate by use of the sputtering apparatus shown in FIG. 1 by means of reactive sputtering under the following conditions: sputtering power supply: DC power supply, target: silicon target, gas: a gas mixture of argon, nitrogen, and a minute amount of oxygen. In Comparative Example 1, the procedure of Working Example 1 was repeated, except that a conventional sputtering apparatus including no auxiliary electrode (i.e., a sputtering apparatus fabricated by replacing the closure plate 72e of the apparatus of FIG. 1 by a plate having no auxiliary electrode) was employed, to thereby form a silicon nitride film containing a minute amount of oxygen on a glass substrate. In each of Working Example 1 and Comparative Example 1, the temperature of the substrate was measured by use of a thermocouple mounted on the substrate. The light transmittance of the thus-formed film was measured at a wavelength of 510 nm; the surface electrical resistance of the film was measured by use of electrodes (length: 1.5 cm each) which were parallelly placed on the film at an interval of 1.5 cm; and the thickness of the film was measured by use of a contact-type thickness meter. The results are shown in Table 1.

TABLE 1

| | Sample No. | |
|---|---|---|
| | Working Example 1 | Comparative Example 1 |
| [Film formation conditions] | | |
| Gas/flow rate | Ar/40 sccm N$_2$/9.5 O$_2$/0.5 | Ar/40 sccm N$_2$/9.5 O$_2$/0.5 |
| Gas pressure | 1.0 Pa | 1.0 Pa |
| Electric power/film formation time | 1500 W/10 min. | 1500 W/10 min. |
| [Increase in the temperature of substrate during film formation] | | |
| Initiation | 28° C. | 27° C. |
| 3 minutes | 57° C. | 64° C. |
| 5 minutes | 65° C. | 87° C. |
| 8 minutes | 71° C. | 98° C. |
| 10 minutes | 73° C. | 101° C. |
| [Evaluation results] | | |
| Light transmittance | | |
| Film on glass substrate | 87% | 77% |
| Film thickness | 3961 Å | 5218 Å |

As is clear from Table 1, when film formation is carried out by means of the method of the present invention, as compared with the case where the conventional apparatus including no auxiliary electrode is employed, an increase in the temperature of the substrate is considerably suppressed, although film formation rate is lowered. The results of measurement of the substrate temperature imply that, by means of the method of the present invention, a compound film can be formed on an organic film (e.g., a polyester film) serving as a substrate without causing any damage to the substrate, while the substrate is allowed to stand in a room-temperature atmosphere; i.e., the substrate is not subjected to cooling treatment. Thus, the method of the present invention exhibits surprisingly practical effects.

Experiments 2 and 3

In Working Example 2, an ITO film was formed on a glass substrate by use of the sputtering apparatus shown in FIG. 1, an indium tin oxide (ITO) target, and a DC power supply (sputtering power supply) under the film formation conditions shown in Table 2. In Working Example 3, the procedure of Working Example 2 was repeated, except that a sputtering apparatus fabricated by replacing the auxiliary electrode of the apparatus of FIG. 1 by the auxiliary electrode of FIG. 6 was employed, to thereby form an ITO film on a glass substrate. In Comparative Example 2, the procedure of Working Example 2 was repeated, except that a conventional sputtering apparatus (i.e., a sputtering apparatus fabricated by replacing the closure plate 72e of the apparatus of FIG. 1 by a plate having no auxiliary electrode) was employed, and the gas pressure was changed as shown in Table 2, to thereby form an ITO film on a glass substrate. The thus-formed ITO films were compared with one another.

The light transmittance, surface electrical resistance, and thickness of each of the films were measured in a manner similar to that of Working Example 1. The results are shown in Table 2.

TABLE 2

| | Sample No. | | |
|---|---|---|---|
| | Working Example 2 | Working Example 3 | Comparative Example 2 |
| [Film formation conditions] | | | |
| Gas/flow rate | Ar/13 sccm | Ar/13 sccm | Ar/13 sccm |
| Gas pressure | 0.11 Pa | 0.11 Pa | 0.12 Pa |
| Electric power/ film formation time | 500 W/4 min. | 500 W/4 min. | 500 W/4 min. |
| [Increase in the temperature of substrate during film formation] | | | |
| Initiation | 32° C. | 23° C. | 26° C. |
| 1 minutes | 33° C. | 28° C. | 31° C. |
| 2 minutes | 35° C. | 33° C. | 36° C. |
| 3 minutes | 36° C. | 36° C. | 39° C. |
| 4 minutes | 37° C. | 38° C. | 41° C. |
| [Evaluation results] | | | |
| Light transmittance/ surface electrical resistance | | | |
| Film on glass substrate | 52%/99 Ω per square unit | 87.5%/29.7 Ω per square unit | 56%/61 Ω per square unit |
| Film thickness | 1843 Å | 1232 Å | 1743 Å |

As shown in Table 2, in the case of Working Example 2, an increase in the substrate temperature during the course of film formation is suppressed, and the film formation rate is increased, as compared with the case of Comparative Example 2. Therefore, when a film having the same thickness as that of a film formed by use of the conventional sputtering apparatus is formed by use of the apparatus employed in Working Example 2, an increase in the substrate temperature is greatly suppressed as compared with the case where the conventional apparatus is employed. Regarding the film of Working Example 2, light transmittance and surface electrical resistance, which are important parameters for determining the quality of a transparent electrically conductive film, are impaired. Conceivably, such quality deterioration is affected by increased film formation rate. The effect of film formation rate on the quality of the film is apparent from the results of the below-described Working Example 4.

As is clear from Table 2, the light transmittance and surface electrical resistance of the film of Working Example 3 are greatly improved as compared with the case of Comparative Example 2. In the case of Working Example 3, an increase in the substrate temperature during the course of film formation is slightly suppressed as compared with the case of Comparative Example 2. However, no great difference is observed between the cases of Working Example 3 and Comparative Example 2 in terms of an increase in the substrate temperature. Meanwhile, in the case of Working Example 3, film formation rate is reduced as compared with the case of Comparative Example 2. As is clear from Table 2, the ITO film of Working Example 3, although having a small thickness, exhibits low electrical resistance; i.e., high quality.

The results of Working Examples 1 through 3 imply that an increase in the substrate temperature can be suppressed by means of the auxiliary electrode, and, when the shape or arrangement of the auxiliary electrode is modified, film formation rate can be increased, or film quality can be improved. The configuration of the auxiliary electrode may be appropriately determined in accordance with the intended purposes on the basis of test data. Thus, the auxiliary electrode serves as means for controlling conditions for film formation by means of sputtering.

Experiment 4

In order to improve the quality of the film formed in Working Example 2, a gas mixture of argon and a minute amount of oxygen gas was employed as a sputtering gas. In a manner similar to that of Working Example 2, by use of the sputtering apparatus of FIG. 1, an ITO film was formed on a glass substrate or on a polyethylene terephthalate (PET) film substrate having a thickness of 40 μm. The light transmittance, surface electrical resistance, and thickness of each of the films were measured in a manner similar to that of Working Example 1. The results are shown in Table 3.

TABLE 3

| | Sample No. Working Example 4 |
|---|---|
| [Film formation conditions] | |
| Gas/flow rate | Ar/13 sccm, $O_2$/0.1 sccm |
| Gas pressure | 0.11 Pa |
| Electric power/film formation time | 500 W/4 min. |
| [Increase in the temperature of substrate during film formation] | |
| Initiation | 25° C. |
| 1 minutes | 31° C. |
| 2 minutes | 35° C. |
| 3 minutes | 38° C. |
| 4 minutes | 39° C. |
| [Evaluation results] Light transmittance/surface electrical resistance | |
| Film on glass substrate | 81%/24 Ω per square unit |
| Film on PET substrate | 85%/22 Ω per square unit |
| Film thickness | 1571 Å |

As is clear from Table 3, when a minute amount (0.8%) of oxygen is added to the sputtering gas, the quality of the resultant ITO film is improved; i.e., even when the concentration of oxygen is at such a low level that the sputtering gas exhibits substantially no adverse effect on the underlying layer, the ITO film exhibits satisfactory performance. As is also clear from Table 3, the ITO film formed on the PET film substrate exhibits high quality. Curling of the ITO film formed on the PET substrate (specifically, curling of the ITO film and the PET substrate in such a manner that the PET substrate shrinks) was found to be suppressed to the minimum extent. In addition, the ITO film was found to be formed on the PET film of low thermal resistance without causing any damage to the PET film (i.e., underlying layer). In Working Example 4, film formation rate is slightly reduced as compared with the case of Working Example 2.

As described above, when the sputtering apparatus of the present invention including the auxiliary electrode is employed, a film of high quality can be formed under film formation conditions different from those under which a film is formed by use of the conventional sputtering apparatus. Therefore, when the sputtering apparatus of the present invention is employed, film formation conditions can be flexibly determined in accordance with the intended purposes. In addition, the sputtering apparatus of the present invention can be applied to a field to which film formation by sputtering has not been applied.

What is claimed is:

1. A box-shaped facing-targets sputtering apparatus comprising a box-shaped facing-targets sputtering unit and a vacuum chamber,
   the sputtering unit including a rectangular parallelepiped frame having six faces, one of which serves as an opening face, and a pair of facing target units, each including a target and magnetic-field generation means formed of a permanent magnet which is provided so as to surround the target,
   which magnetic-field generation means generates a facing-mode magnetic field extending in a direction perpendicular to the surface of the target and a magnetron-mode magnetic field extending in a direction parallel to the target surface, in which the target units are provided on first opposing faces of the frame which are located adjacent to the opening face, and second opposing faces and the remaining one face of the frame are shut by shutting plates,
   wherein the sputtering unit is provided on the vacuum chamber such that the opening face faces the vacuum chamber and a substrate on which a thin film is to be formed, the substrate being disposed in the vacuum chamber; and an anode electrode comprises substantially the frame and the shutting plates; and further comprising an auxiliary electrode which absorbs electrons, in a plasma confinement space being provided in the interior of the sputtering unit.

2. A box-shaped facing-targets sputtering apparatus according to claim 1, wherein each of said pair of facing target units comprises a support which has a receiving section for receiving the target at a center thereof, an accommodating section for accommodating a permanent magnet in a peripheral wall defining the receiving section, and electron reflection means for reflecting electrons, wherein the electron reflection means is disposed at a front end portion of the peripheral wall or in the vicinity of the front end portion.

3. A box-shaped facing-targets sputtering apparatus according to claim 2, wherein the auxiliary electrode is provided in front of the electron reflection means.

4. A box-shaped facing-targets sputtering apparatus according to claim 1, wherein the auxiliary electrode is provided on a center line of the plasma confinement space or in the vicinity of the center line, the center line extending in parallel to the targets.

5. A box-shaped facing-targets sputtering apparatus according to claim 4, the center line extending along a direction parallel to the longer side of the targets.

6. A box-shaped facing-targets sputtering apparatus according to claim 1, wherein the auxiliary electrode is a U-shaped electrode formed from an electrically conductive material, and is attached to a closure plate which covers a face that is opposite to the opening face.

7. A box-shaped facing-targets sputtering apparatus according to claim 1, wherein the auxiliary electrode is made of an electrically conductive pipe and is attached to a closure plate which covers its corresponding face so as to cool the auxiliary electrode.

8. A box-shaped facing-targets sputtering apparatus according to claim 1, further comprising yoke means which magnetically connects open-side facing magnetic poles of the permanent magnets of each of the target units, the magnetic poles being located on the outward side of the unit.

9. A box-shaped facing-targets sputtering apparatus according to claim 8, wherein the yoke means comprises, on the support of the facing target units, pole sections made of a magnetic material so as to cover the open-side magnetic poles of the permanent magnets, and a connection section formed of a magnetic material which is provided on a face of the box-shaped sputtering unit so as to magnetically connect the pole sections.

10. A box-shaped facing-targets sputtering apparatus according to claim 9, wherein the connection section is formed of a plate having an opening, and is provided on the opening face of the box-shaped sputtering unit.

11. A box-shaped facing-targets sputtering apparatus according to claim 1, which further comprises magnetic-field regulation means for predominantly regulating a magnetron-mode magnetic field which is provided on the back side of each of the targets.

12. A box-shaped facing-targets sputtering apparatus according to claim 11, wherein the magnetic-field regulation means is a permanent magnet.

13. A method for producing a compound thin film, comprising the steps of:
providing a box-shaped facing-targets sputtering apparatus comprising a box-shaped facing-targets sputtering unit and a vacuum chamber,
the sputtering unit including a rectangular parallelepiped frame having six faces, one of which serves as an opening face, and a pair of facing target units, each including a target and magnetic-field generation means formed of a permanent magnet which is provided so as to surround the target,
which magnetic-field generation means generates a facing-mode magnetic field extending in a direction perpendicular to the surface of the target and a magnetron-mode magnetic field extending in a direction parallel to the target surface, in which the target units are provided on first opposing faces of the frame which are located adjacent to the opening face, and second opposing faces and the remaining one face of the frame are shut by shutting plates,
wherein the sputtering unit is provided on the vacuum chamber such that the opening face faces the vacuum chamber and a substrate on which a thin film is to be formed, the substrate being disposed in the vacuum chamber; and further comprising an auxiliary electrode which absorbs electrons, in a plasma confinement space being provided in the interior of the sputtering unit;
placing the substrate at the disposed position in the sputtering apparatus; and forming the compound thin film on the substrate by sputtering with a sputtering current.

14. A method for producing a compound thin film according to claim 13, wherein the compound thin film is oxide thin film or nitride thin film.

15. A method for producing a compound thin film according to claim 14, wherein the compound thin film is oxide thin film, and the film is formed by use of an oxide target predominantly containing an oxide which constitutes the thin film, in the presence of an inert gas which serves as a sputtering gas and contains oxygen in an amount of 1 vol. % or less.

16. A method for producing a compound thin film according to claim 15, wherein the oxide thin film is a transparent electrically conductive thin film.

17. A method for producing a compound thin film according to claim 16, wherein the oxide thin film is indium tin oxide thin film.

18. A method for producing a compound thin film according to claim 13, wherein the compound thin film is nitride thin film, and the film is formed by use of a nitrogen-containing inert gas serving as a sputtering gas and containing oxygen in an amount of 1 vol. % or less, and a target predominantly containing the nitride-constituting elements other than nitrogen.

19. A method for producing a compound thin film according to claim 18, wherein the nitride thin film is silicon nitride thin film.

20. A method for producing a compound thin film according to claim 13, wherein the thin film is formed while the substrate is allowed to stand at room temperature.

21. A method for producing a compound thin film according to claim 13, wherein the sputtering current is a DC current.

22. A method for producing a compound thin film according to claim 13, wherein the substrate on which the film is formed or a surface layer of the substrate is formed of an organic substance.

* * * * *